(12) United States Patent
Reinert et al.

(10) Patent No.: US 10,002,896 B2
(45) Date of Patent: Jun. 19, 2018

(54) HOUSING FOR AN INFRARED RADIATION MICRO DEVICE AND METHOD FOR FABRICATING SUCH HOUSING

(75) Inventors: Wolfgang Reinert, Neumünster (DE); Jochen Quenzer, Itzehoe (DE); Sebastien Tinnes, Tullins (FR); Cécile Roman, Lans en vercors (FR)

(73) Assignees: FRAUNHOFER-GESELLSCHAFT ZUR FOERDERUNG DER ANGEWANDTEN FORSCHUNG E.V., Munich (DE); ULIS SAS, Veurey-Voroize (FR)

( * ) Notice: Subject to any disclaimer, the term of this patent is extended or adjusted under 35 U.S.C. 154(b) by 397 days.

(21) Appl. No.: 13/379,263

(22) PCT Filed: Jun. 21, 2010

(86) PCT No.: PCT/EP2010/058748
§ 371 (c)(1),
(2), (4) Date: Dec. 19, 2011

(87) PCT Pub. No.: WO2010/146183
PCT Pub. Date: Dec. 23, 2010

(65) Prior Publication Data
US 2012/0097415 A1    Apr. 26, 2012

(30) Foreign Application Priority Data
Jun. 19, 2009  (EP) .................. 09163317

(51) Int. Cl.
*H05K 5/00* (2006.01)
*C25D 5/02* (2006.01)
(Continued)

(52) U.S. Cl.
CPC ........ *H01L 27/14618* (2013.01); *G01J 5/045* (2013.01); *G01J 5/0875* (2013.01);
(Continued)

(58) Field of Classification Search
USPC ...... 257/227, 338.1, 749, E27.118, E27.122, 257/E31.054, E31.093
See application file for complete search history.

(56) References Cited

U.S. PATENT DOCUMENTS

| 5,450,053 A | 9/1995 | Wood |
| 6,001,696 A | 12/1999 | Kim et al. |

(Continued)

FOREIGN PATENT DOCUMENTS

| DE | 102008060796 A1 | 5/2010 |
| EP | 0734589 A1 | 10/1996 |

(Continued)

OTHER PUBLICATIONS

XP-002550724; Database WPI Week 200343; Thomson Scientific; London, GB.
(Continued)

*Primary Examiner* — Ori Nadav
*Assistant Examiner* — Ernest Allen, III
(74) *Attorney, Agent, or Firm* — Stevens & Showalter LLP

(57) ABSTRACT

Infrared radiation micro device, cover for such a device and method for its fabrication, the device comprising a substrate and a cover and an infrared radiation detecting, emitting or reflecting infrared micro unit, the infrared micro unit being arranged in a cavity defined between the substrate and the cover, the cover comprising an antireflective surface texture to enhance the transmissibility of infrared radiation, wherein a distance frame formed in an additive process on the substrate side of the cover and/or the cover side of the substrate is arranged between substrate and cover.

10 Claims, 4 Drawing Sheets

(51) Int. Cl.
*H05K 13/00* (2006.01)
*H01L 27/146* (2006.01)
*G01J 5/04* (2006.01)
*G01J 5/08* (2006.01)

(52) U.S. Cl.
CPC .. H01L 27/14683 (2013.01); *H01L 27/14649* (2013.01); *H01L 2224/16* (2013.01); *H01L 2924/01019* (2013.01); *H01L 2924/01057* (2013.01); *H01L 2924/01077* (2013.01); *H01L 2924/01078* (2013.01); *H01L 2924/01079* (2013.01); *H01L 2924/01322* (2013.01); *H01L 2924/01327* (2013.01); *H01L 2924/10157* (2013.01); *H01L 2924/10158* (2013.01); *H01L 2924/1461* (2013.01)

(56) References Cited

U.S. PATENT DOCUMENTS

| | | | |
|---|---|---|---|
| 6,030,900 | A | 2/2000 | Grassi et al. |
| 6,157,042 | A * | 12/2000 | Dodd ............... B82Y 20/00 257/21 |
| 6,228,770 | B1 * | 5/2001 | Pradeep ............ H01L 21/7682 216/38 |
| 2002/0025637 | A1 | 2/2002 | Maeda |
| 2002/0037626 | A1 | 3/2002 | Muth |
| 2004/0072384 | A1 | 4/2004 | Cole |
| 2004/0140570 | A1 * | 7/2004 | Higashi ............... G01J 5/20 257/777 |
| 2007/0170363 | A1 * | 7/2007 | Schimert et al. ............ 250/353 |
| 2008/0277672 | A1 | 11/2008 | Hovey et al. |
| 2008/0283991 | A1 * | 11/2008 | Reinert ............... B81B 7/007 257/685 |
| 2009/0140146 | A1 * | 6/2009 | Sogawa ............. H01L 23/047 250/338.1 |
| 2012/0132522 | A1 * | 5/2012 | Foster ............. B81C 1/00285 204/298.11 |

FOREIGN PATENT DOCUMENTS

| | | |
|---|---|---|
| EP | 1463120 A | 9/2004 |
| EP | 2065930 A | 6/2009 |
| JP | 61000723 A | 1/1986 |
| JP | 1216219 A | 8/1989 |
| JP | 2003149434 A | 5/2003 |
| JP | 2003249434 A | 9/2003 |
| WO | 2005067047 A2 | 7/2005 |
| WO | 2007054524 A1 | 5/2007 |
| WO | 2007069750 A1 | 6/2007 |

OTHER PUBLICATIONS

Motamedi, M.E. et al.; Antireflection Surfaces in Silicon Using Binary Optics Technology; Applied Optics, OSA, Optical Society of America; Aug. 1, 1992; vol. 31, No. 22; pp. 4371-4376; Washington, D.C.

Persat, Nathalie; International Search Report; Application No. PCT/EP2010/058748; dated Dec. 7, 2010; European Patent Office.

Communication pursuant to Article 94(3) EPC; European Patent Application No. 10725764.4; dated Jun. 9, 2015; European Patent Office; Munich, Germany; see text pertaining to US 2008/277672 on last four pages of document.

* cited by examiner

HOUSING FOR AN INFRARED RADIATION MICRO DEVICE AND METHOD FOR FABRICATING SUCH HOUSING

BACKGROUND OF THE INVENTION

Field of the Invention

The application relates to the field of infrared radiation micro devices as for example infrared micro-bolometer sensors, infrared micro-mirrors or infrared radiation emitting micro-devices. The application also refers to the packaging and the method of production of such devices, especially on wafer level.

Description of Related Art

Uncooled infrared array detectors based on resistive bolometer micro-bridges integrated on CMOS read out circuits have shown their potential in a variety of applications working typically with wavelength in the range of about 8 µm to 14 µm. The detection principle of infrared radiation is based on the temperature rise of the micro-bolometer arrays acting as detector by absorbed IR-radiation causing a change of electrical resistance that is measured. The performance of uncooled micro-bolometer arrays on a semiconductor substrate depends greatly on their thermal isolation. Due to this, the bolometer design should be optimised for minimal thermal coupling of the suspension structures towards the substrate. Additionally, as a gas environment surrounding the micro-bolometer arrays increases thermal conduction due to molecular heat flow, therefore a high vacuum packaging is beneficial to improve the overall device performance.

Hermetic wafer bonding which is well known in micro system packaging technology can be applied to protect the infrared micro-bolometer arrays against environmental stresses, such as moisture, dirt, destructive mechanical forces and corrosion. Infrared radiation detecting micro-bolometer sensor units are provided on a substrate, which may be capped by a cover, such that substrate and cover provide a cavity in which the bolometer sensor units are arranged. While adapted to provide a vacuum or an atmosphere with sufficient low pressure around the bolometer sensor unit the cover must be sufficiently transparent to IR-radiation to expose the micro-bolometer sensor unit to IR-radiation and to transmit IR-radiation.

Usually, silicon is used as material for the cover to cap the infrared micro-bolometer arrays on the substrate wafer. Silicon has the same coefficient of expansion as the sensor wafer, is capable of infrared transmission in a range of about 1 µm to 18 µm, compatible with most semiconductor and MEMS processes as well as antireflection coating processes, offers very good properties as vacuum/low pressure package material and is mechanically robust to withstand the air pressure on the package. However the use of a silicon cover material requires appropriate action to reduce insertion losses of IR-radiation. Otherwise up to 50-60% of the incident IR-radiation is reflected by the silicon material surfaces of the cover due to its high refractive index of 3.45.

To reduce the reflection loss of silicon it is known to apply a micro-structured surface texture on the cover. US 2004/0072384 teaches to etch a field of posts first, forming the above surface texture, and to form afterwards a cavity of 100 µm depth by an additional etching process. This method is referred to as a subtractive process. It is a drawback of this method that the etching process of the cavity after forming the surface texture negatively affects the geometry of the structure, especially the side geometry of the posts whose diameters are reduced and whose profiles become cone shaped if not the posts are transformed in flat lens shaped structures. The loss of geometry and shape results in an undesirable higher reflection of the incoming IR-radiation and accordingly causes higher insertion losses.

To provide the cavity first and to etch the surface texture later presently seems to be no solution for the above problem. The fabrication of a micro-structured surface texture with geometrical specifications capable of reducing insertions losses inside a pre-fabricated cavity deeper than 50 µm is challenging and is far beyond the state of the art. The reason for this is that high resolution wafer steppers required to generate the fine details of the micro-structured surface texture for reducing the reflection losses of IR-radiation have a limited depths of focus, which makes their usage for the texturing process at the bottom of the cavities inappropriate.

Beside the provision of a micro-structured surface texture there are other possibilities to reduce insertion losses of IR-radiation. For example, an optical interface layer with reduced refractive index may be provided on the silicon material. The interface layer may be a single thin film as AlN or diamond like carbon (DLC) or may be a multilayer thin film as Ge—ZnS. The physical properties, process conditions and process integration risks of these antireflective elements are very different. EP 0734589 (Honeywell) teaches to apply inside the cavity an antireflective coating of a material other than the cover material itself. However, depending on the deposition processes and outgassing characteristics of known antireflective layers this solution seems to be problematic. Outgassing of Argon and Hydrogen is observed in sputtered thin film coatings. Beside the evolution of these gases which can not be absorbed by any getter material, the mostly used anti-reflective system used for IR applications Ge—ZnS is very limited due to its low decomposition temperature of 320° C. and bad structuring properties. Additionally, the vacuum compatibility of all layers incorporated in the sealed cavity is essential. Since the available volume of the addressed micro package has a very limited physical buffer capacity, even the outgassing of trace gases of the thin film stacks inside the cavity which can result in a drastic pressure rise to a level far outside the specified vacuum level.

Although wafer bonding is performed in a high vacuum environment, the vacuum level within the device cavities accommodating the micro-bolometer sensor units is typically degraded by surface outgassing. The resulting loss of vacuum reduces the precision and measurement quality of the sensor device. To overcome this drawback, it is generally known to integrate a getter active material that continuously removes outgassed molecules during the device lifetime. Another possibility to minimize the influence of a loss of vacuum to precision and measurement quality is to provide a cavity with sufficient volume so that outgassing has a lesser influence.

Based on the above prior art it is the object of the present invention to provide a housing for an infrared radiation micro device and a multi housing wafer unit and a method for producing such housing and wafer unit, wherein transmission of IR-radiation especially in the range of 8-12 µm is improved and wherein the effect of outgassing into the sensor cavity is minimized.

BRIEF SUMMARY OF THE INVENTION

The solution on the device side for the above object is a housing for an infrared radiation micro device, comprising a substrate and a cover, wherein a cavity for housing an infrared radiation detecting, emitting or reflecting infrared micro unit is defined between the substrate and the cover, the cover comprising an antireflective surface texture to enhance the transmissibility of infrared radiation, wherein a silicon distance frame, for example CTE matched, formed in an additive process on the substrate side of the cover and/or the cover side of the substrate is arranged between substrate and cover.

The housing according to the present invention can be used for an infrared radiation micro device as for example an infrared micro-bolometer sensor, an infrared micro-mirror or an infrared micro-emitter. The housing comprises a substrate and a cover, which are joined together with a distance frame in between, such that substrate, cover and distance frame provide a cavity, which cavity houses an infrared micro unit. The cavity preferably is hermetically sealed, such that a high vacuum may be provided within. The cover material itself has IR-radiation transmissibility of preferably about 30-50%. Preferably, the cover material is silicon; however, any material with a similar IR-radiation transmissibility may be used, as for example Germanium or crystals like feldspar. The same applies to the substrates material.

According to the invention the cover comprises an antireflective surface texture which enhances the transmissibility of infrared radiation through the cover material. For the purpose of simplification it is referred to as texture only in the following. The texture may be arranged on any appropriate place on the cover, in particular on the substrate side of the cover or on the substrate far side of the cover or on both sides. The substrate side of the cover in the sense of the present description is that side of the cover, which is directed to the substrate when cover and substrate are bonded to each other. The substrate side of the cover therefore is that side of the cover which is directed towards the cavity provided between cover and substrate. The substrate far side of the cover is the side opposite the substrate side of the cover, i.e. is directed to the outside of the housing. The area of the texture is an area of enhanced transmissibility of IR-radiation and may also be designated as IR-radiation window.

By using the texture as antireflective element on the substrate side of the cover for enhancement of transmissibility of IR-radiation, the vacuum compatibility of the antireflective element is very good and transmission characteristics and technology matureness enable a fabrication of these elements on 150 mm wafers and 200 mm wafers with high yield. The structures of the antireflective surface texture do not outgas process gases as for example Argon, are compatible with the complete process flow of the production of IR-micro devices and possess a high process temperature tolerance and chemical inertness. The texture can be provided with high accuracy and good optical quality while at the same time the infrared micro unit can be provided within a cavity of sufficient volume to diminish the negative effect of outgassing process gasses, especially of non-getterable gases. With other words, the volume of the cavity can be increased without decreasing the quality of the antireflective surface texture, what has been a problem in the state of the art. A large cavity height available by the additive distance frame helps to suppress ghost pictures by multi-reflections. According to the invention the antireflective surface texture may provide a transmission window enhancing transmissibility of long wavelengths while blocking short wavelengths below 7 μm.

Generally, the texture may be formed by elevations, preferably posts, or depressions, preferably holes, or both of them. It may be etched into or out of the material of the cover. With advantage, the texture is provided in a geometrical pattern. It is preferred if the antireflective surface texture is arranged at least on the substrate side of the cover. To further enhance the infrared radiation transmissibility the antireflective surface texture may also be arranged on both sides of the cover. In this case, the antireflective surface texture on the substrate far side of the cover, i.e. the outside of the cover, may be provided in a cavity 0 to 50 μm below the surface of the cover. This helps in preventing scratching. The top surface of the antireflective surface texture on the substrate side of the cover preferably levels with the ceiling surface of the cavity. A portion of the antireflective surface texture(s) on the outward and/or the inward surface of the cover may be optimised in a defined area for short wavelengths in the range 2 μm to 5 μm and blocking longer wavelengths.

In any case the antireflective surface texture on any side of the cover may be formed by geometrical defined cylinders in a hexagonal or square pattern with a diameter preferably between 400 nm to 3000 nm, a spacing of preferably less than 5000 nm and an etch depth of preferably 600 nm to 1800 nm. Round pillars with a diameter of 1.57 μm in a hexagonal period with a 2.6 μm pitch and a 1.5 μm etch depth show a good performance. From simulation results, square pillars with 1.4 μm side length, 2.04 μm pitch and 1.35 μm height are optimum. In one embodiment the texture geometry is etched at least 800 nm deep.

According to the publication "Antireflection surfaces in silicon using binary optics technology" of M. E. Motamedi, W. H. Southwell, W. J. Gunning in Applied Optics Vol. 31, No. 22, 1992, pages 4371-4376, the effective refractive index $n_{eff}$ of an etched pillar array depends upon the refractive index of the substrate material $n_s$ and the fill factor $f=f_p/f_f$ of the pillars $f_p$ to the total field area $f_f$. A symmetric field of pillars may be considered as a two-dimensional (or crossed) rectangular grating with the same effective refractive index $n_{eff}$ for both incident polarization components approximately given by:

$$n_{eff} = \left[ \frac{[1-f+f\cdot n_s^2]\cdot[f+(1-f)n_s^2]+n_s^2}{2[f+(1-f)n_s^2]} \right]^{\frac{1}{2}}, \quad (2)$$

with the volume fraction of the square pillars $f=a^2/b^2$ (for round pillars the fill factor or volume fraction is $f=\pi(d/2)^2/b^2$), a and b being the pillar width and the pitch. The desired volume fraction f is determined by setting $n_{eff}=\sqrt{n_s}$ and solving equation (2) for f, see FIG. 7. The volume fraction of the same pillar structure in square and hexagonal periodicity differ by a factor $$f_{hexa} = \frac{2}{\sqrt{3}} \cdot f_{square} \approx 1.15 \cdot f_{square}.$$

The grating periodicity b must be far beyond the addressed wavelengths of interest to avoid diffraction and scatter. This property generates unwanted narrow transmission bands for short infrared wavelength below 8 μm. The largest pitch for onset of diffraction in the substrate is given by formula (3), with incident light angle θ and refractive index of the media before the substrate $n_i$:

$$b < \frac{\lambda}{n_s + n_i \sin\theta}. \tag{3}$$

If the optical housing of the bolometer device blocks light with incident angle larger than 30° and the smallest wavelength of interest is 8 µm the typical pillar pitch is around 2 µm.

For perpendicularly incident light the pillar pitch must be lower than b=2.34 µm. Based on this period, a pillar diameter a=1.67 µm is best to a achieve an effective refractive index of $n_{eff}$=1.85. For the etch depths, t, is one quarter wave in optical thickness, $$t = \lambda/4n_{eff}, \tag{4}$$

where λ is the center wavelength at which the reflection becomes minimal. For 10 µm center wavelength and a silicon cover the etch depths should be around t=1.35 µm.

More detailed simulation indicates that the form factor is the parameter with largest influence on the optical properties. This means that structures have to be reproduced in their geometry very accurately which is one of the benefits of the present invention.

As already stated above, the antireflective surface texture can be provided on both sides of the cover. In this case it is of particular advantage if the texture applied on the substrate far side of the cover differs from the texture applied on the substrate side of the cover. For example, one, some or all of the form, dimension in each direction, especially dimension in a direction orthogonal to the substrate surface, arrangement and composition of elevations and/or depressions can differ. The two different textures act as a step filter. It is convenient that by the present invention a step filter can be provided by the structure of the covers material itself, especially from silicon. The inventors have found that due to the spacing of elevations/depressions of the surface texture or its periodicity for the desired centre wavelength diffraction and scattering can occur for some specific shorter wavelengths that increase their unwanted insertion and transmission (short wavelength transmission) through the cover. The combination of two different textures on the top and lower cap surface with slightly different short wavelength transmission characteristics can be applied so that an effective blocking of wavelengths below 7 µm (high bandpass filter) without the use of additional thin film multi-layer coatings can be achieved.

The silicon distance frame acts as joining material between cover and substrate and preferably forms a hermetic seal between substrate and cover. The silicon distance frame is preferably of poly-crystalline silicon at least in part. By the thickness of the distance frame the volume of the cavity between substrate and cover is defined. It is an advantage of the invention that according to the thickness of the distance frame the volume of the cavity housing the micro-bolometer units can be increased, without any decoupled influence to the antireflective surface texture. During production the distance frame is formed in an additive process on the substrate side of the cover and/or the cover side of the substrate. By using the distance frame to define the distance between substrate and cover and therefore to define the volume of the cavity it is possible to provide the antireflective surface structure very accurately with a precise geometry, which serves for a high IR-radiation transmission. The quality of accurateness of the texture is not deteriorated when providing a cavity of high volume. Therefore, an infrared radiation micro device can be provided with good optical properties and high cavity volume at the same time.

The distance frame is made of silicon, preferably of poly-crystalline silicon at least in part. By the use of silicon for the distance frame, in the case of a silicon cover and/or a silicon substrate thermo mechanical stresses on the cover are reduced in comparison to thin film anti-reflective coating deposition. The additive deposition process of the distance frame structures with advantage is a mature process with sufficient wafer throughput. Preferably, the silicon distance frame is build around the antireflective surface texture. The cavity formed by the silicon distance frame preferably is about 1-1000 µm deep. The silicon distance frame preferably is 20 µm to 800 µm wide, most preferred 80-300 µm. Preferably, the silicon distance frame is substance-to-substance bonded to the cover and/or the substrate. This means that no additional adhesive, glasfrit or metal layer has to be used. Again preferred, between the silicon distance frame and the cover and the substrate, respectively, there is no silicon oxide layer.

The infrared micro unit may be an infrared sensor, an infrared micro-bolometer, an infrared micro-mirror or an infrared radiation emitting micro-device. Especially it may be a common micro-bolometer sensor array. It is arranged in the cavity defined by cover, substrate and distance frame, which is hermetically sealed against the environment. In the cavity a vacuum or at least a very low pressure atmosphere is provided. According to a preferred embodiment of the invention the infrared micro unit is arranged on the substrate, preferably opposite the antireflective surface texture of the cover.

Additional IR micro units, especially infrared sensor elements, can be positioned beside the IR micro unit of each device, especially beside an IR micro bolometer unit. The additional IR micro bolometer units are not necessarily exposed to 8 µm to 12 µm infrared radiation. These specific sensor elements enable device self test functionalities, such as cavity vacuum check, improved background detection and further functions.

According to a preferred embodiment of the invention a thin film antireflective coating is arranged on the substrate far side of the cover opposite of the antireflective surface texture on the substrate side of the cover. Preferably, the thin film antireflective coating has a high pass property for wavelengths longer than 5.5 or 8 µm. The thin film antireflective coating can act as a filter that eliminates such short wavelength and is advantageous for image quality due to fading out certain parts of sunlight for example. While it is of advantage to provide the antireflective surface texture on the substrate side of the cover i.e. on the side of the cover facing the cavity housing the infrared micro devices, to avoid outgassing effects into the cavity, on the substrate far side of the cover the use of an antireflective layer does not influence the quality of vacuum in the cavity. According to a special embodiment a GeZnS multi-layer film can provides a better suppression of short wavelength radiation. The thin film antireflective coating preferably is a quarter-wave layer stack with a refractive index equal to the square root of the substrate refractive index, $$n = \sqrt{n_s}$$

where $n_s$ is the refractive index of the substrate (e.g. silicon $n_s$=3.42 for λ=10 µm). With advantage neither an antireflective film coating nor an antireflective surface texture is birefringent what means that the surface transmission is the same for both polarization components of the incident light.

According to another embodiment of the invention, the substrate far side of the cover may be coated with an infrared blocking layer. This layer may be provided on the whole cover except for an area opposite the antireflective surface texture, this means except for the IR-radiation window. The infrared blocking layer may be a silicon oxide layer like a TEOS-layer (tetraethyl orthosilicate) or a metal layer as for example Al. Because the infrared blocking layer is not arranged in the area of the IR-radiation window it provides a lens aperture or optical diaphragm which may enhance the optical properties as image quality of the IR micro device.

To enhance the vacuum quality, according to a further embodiment a getter material may be provided in the housing cavity. However, a typical thin film getter has only a very limited getter capacity due to a small reactive surface. It is therefore advantageous, if a portion of the substrate side of the cover is structured with an arbitrary texture, which texture is coated with a getter active metal film. The getter capacity of evaporated thin film getter can be improved by an increase of the effective getter surface realized by induced columnar grain growth achieved by depositing a getter film on the vertical sides of trench structures in silicon. Such a getter arrangement is known from the German Patent application DE 10 2008 060 796.7 of the applicant, which is incorporated by reference herein. The arbitrary texture is formed as a first fine structure onto or into the substrate or cover. Preferably, the arbitrary texture is formed out via etching, in particular by dry etching with active gases as for example $CF_4$ and $SF_6$, alternately. An anisotropic dry etching or high rate etching is suited very good. Also, the arbitrary texture can be formed via laser engraving. By the arbitrary texture structures are formed in or at the substrate/cover which structures comprise surfaces or walls essentially vertical or inclined in relation to the substrate-/cover plane. These inclined or vertical areas constitute surfaces to be coated with the getter material. By providing the arbitrary texture, the surface of the substrate/cover is enlarged, so that more getter material can be disposed compared to a flat substrate-/cover surface.

The getter material may be coated onto the arbitrary texture in form of a second fine structure, which second fine structure beside the arbitrary texture further enlarges the effective getter surface. In addition to the enlargement by the arbitrary texture, the second fine structure of the getter material itself further enlarges the effective getter surface.

The getter material can be applied by evaporating or sputtering. Especially in the case of dry etching with two different reactive gases in rotation/alternately on the vertical or inclined surfaces of the arbitrary texture wave or bump like elevations and/or depressions may be formed. These elevations/depressions serve as points for nucleation at which the getter material is deposited in favour, so that the getter material forms a lamellar structure, which provides the second fine structure. The distance between adjacent lamellas is in the range of 60 to 400 nm depending on the gas changing frequency. Adequate getter materials comprise metals as Ti, Cr, Zr, Al, V, Co, Hf, Ba, Fe, La, in particularly as clean metal or any intended alloy of these metals as for example TiAl, ZrAl, TiSi, TiZr or ZrCo. The use of porous $SiO_2$ is of particular advantage. It is also possible, to provide two or more clean metals or alloys or a defined sequence of different getter material layers.

According to another embodiment a seal frame metallization is provided on the distance frame. The seal frame metallization preferably is made from a thin film layer of about 1 μm. The metallization preferably comprises Au, AuSn, AuIn, or Au/softsolder or combinations thereof. The total gas pressure inside the cavity after sealing preferably is below 1·10E-4 mbar, the achieved hermeticity of the metallic seal frame is better than a standard air leak rate of 10E-14 mbar l/s. The low vacuum level reduces with advantage any cross talk between the elements of the sensor array. The cavity seal can be formed on a part of the active surface of an integrated read out circuit surrounded by a perimeter area with electrical contact pads.

The metallic seal frame material may also be provided at the sides of the distance frame. This additional seal frame material can be used in controlling the spread of wetting of excess metal melts in the encapsulation of the micro device. The seal frame material at the side of the distance frame serves as a buffer layer absorbing excess solder. Therefore, the seal frame material at the side of the distance frame should have a very small wetting angle for liquid droplets of a liquid solder material. Generally, such a material additionally has a certain holding capacity for the liquid solder material so that it is "sucked in", this additionally contributes the desired effect. Such a buffer is known from WO 2007/054524 of the applicant, which is incorporated by reference herein. According to a further embodiment the metallic cover seal is arranged on a part of the integrated read out circuit. All necessary electrical interconnections pass the seal frame below the wafer passivation and connect to individual bond pads outside the sealed housing.

As it will appear from the following description the invention also refers to IR-micro devices and methods for their fabrication on wafer level. The invention therefore also refers to a multi housing wafer unit comprising an infrared radiation micro device according to the present invention. Such a multi housing wafer unit can be used for fabrication of Infrared radiation micro devices on wafer level by wafer dicing. Any disclosure made in the description of the invention in relation to the whole IR-micro device also refers to the multi housing wafer unit.

On the method side the invention refers to a method for fabricating a housing for an infrared radiation micro device preferably on wafer level, the housing comprising a cover and a substrate, the process comprising the following steps:

masking the cover with a pattern for forming a surface texture, etching the cover to create an area with the surface texture comprising elevations and/or depressions that reduce the effective refractive index of the cover, providing a silicon distance frame on the substrate side of the cover or the cover side of the substrate, and performing bonding of substrate and cover with intermediate distance frame, preferably in high vacuum, such that substrate, cover and distance frame form a cavity for housing an infrared radiation micro device.

Although parts of the descriptions and the claims are directed to a method for fabricating the housing on basis of a single IR-micro device, the inventions also refers to a method for fabricating a multi housing wafer unit on wafer level. In this case, the substrate and/or the cover are provided in form of a substrate wafer and a cover wafer, respectively. The multi housing wafer unit comprises the substrate wafer and the cover wafer, which are bonded to each other by at least one distance frame provided in an additive process. By substrate wafer, cover wafer and distance frame at least one preferably a number of cavities are formed, which house one or more IR-radiation micro units. With advantage for each IR micro unit a separate distance frame is provided. With other words the multi housing wafer unit comprises a number of IR-radiation micro devices (bolometer sensor, micro mirror, IR emitter) that are intended to be individualized during the following fabrication of the IR-radiation micro devices. For the sake of convenience in the following description the used expressions cover and substrate also have the meaning of a cover wafer and substrate wafer, respectively.

By the method according to the invention it is possible to first form the antireflective surface texture out of the material of the flat cover surface and thereafter to build on the structures of the distance frame by an additive deposition process. By an additive deposition process additive material is attached/applied on the cover surface or the substrate surface forming a distance frame with an elevated surface relative to the cover/substrate surface attached by separate substrate bonded to or applied as deposited film layer. This means that the cavity can be formed after the wafer surface modification for improved infrared insertion. Because the volume of the cavity and the distance between cover and substrate is defined by the distance frame after the antireflective surface texture had been applied, no additional steps are required, which could decrease the quality and accurateness of the antireflective surface texture. After the antireflective surface texture had been applied on the cover, a protective etch stop layer can be applied which prevents a decrease of quality of the texture during subsequent processing steps. Because of that, the texture maintains its geometrical form and shape and therefore its intended antireflection properties. Additionally, it is possible to provide the antireflective surface texture on the flat cover substrate and not in a preshaped cavity, what further enhances quality of the antireflective surface texture and especially the image quality of the micro device, because the texture can be produced in the focus layer of the etching procedure. Preferably, the silicon distance frame grows in an epitaxial manner on the cover and/or the substrate material.

Preferably, the antireflective surface texture is provided at least on the substrate side of the cover. As already stated in the description of the housing it may also be provided on both sides of the cover. The texture on the substrate far side of the cover may be etched in a cavity 0 to 50 μm below the surface of the cover for example by gas phase high rate etching. Preferably, the texture on the substrate far side of the cover is etched with a defined geometrical pattern of different elevations as posts or depressions as holes than the texture on the substrate side of the cover. In any case the texture on any side of the cover may be formed by etching geometrical defined cylinders in a hexagonal or cubic pattern with a diameter preferably between 400 nm to 3000 nm, a spacing of preferably less than 5000 nm and an etch depth of preferably 600 nm to 1800 nm. In one embodiment the texture geometry is etched at least 800 nm deep.

The sensor device housing can be performed by wafer bonding using a cover wafer as cover of infrared transparent material with improved infrared antireflection surfaces under provision of distance frames around each chip (IR-micro unit) preferably with metallic seal material. The cover is aligned and bonded to a substrate wafer as substrate in a controlled atmosphere, which can be high vacuum or specific gases or gas mixtures. A defined cavity volume is thereby formed preferably around each IR-micro unit providing an ideal working environment to obtain maximum sensor sensitivity.

Preferably, the silicon distance frame is substance-to-substance bonded to the cover and/or the substrate. Preferably, no additional adhesive, glasfrit or metal layer is used. Again preferred, between the silicon distance frame and the cover and the substrate, respectively, there is no silicon oxide layer. The substrate and cover wafer are preferably plasma-activated just before bonding and the bond joint is formed and annealed under pressure and an applied temperature in the range of 200° C. to 450° C. For a good joint formation and hermeticity a good surface quality of both substrate and cover, both in respect to wafer warpage, total thickness variation and roughness is advantageous. A surface roughness of mating surfaces in the joint better than 3 nm is preferred, more preferably a roughness around 1 nm can be used.

According to one embodiment of the invention, the distance frame is provided in form of a silicon distance frame by masking cover or substrate with a structured TEOS layer that defines the growth regions of the silicon distance frame, depositing the material for the silicon distance frame and removing the TEOS layer in a defined pattern of the cover or the substrate. In this sense "structured TEOS layer" means that the TEOS layer does not cover the complete cover but only those areas of the cover in which no silicon material growth should occur.

A thick distance layer can be deposited by low pressure chemical vapour deposition (LP-CVD) of silicon in two different forms. Depending on the exposed substrate surface material, the precursor gas and back etching and the nucleation process applied to prime the substrate, either a full silicon layer or a selective silicon growth (in form of rings etc.) is achieved. After the deposition of a full distance layer, an etching process forms individual distance frames of defined height. Silicon distance frames can be applied directly to form a eutectic gold/silicon seal bond with a gold frame on the sensor wafer. To lower the necessary joining temperature additional metallic AuSn seal material can be deposited on the distance frame to form a eutectic gold/tin seal bond. This technique can also be applied for distance frames of other materials than silicon.

Alternatively, the distance layer can be provided by bonding a wafer substrate to the inner side of the cover or cover wafer using known wafer bonding techniques. Especially, the distance frame may be provided in form of a silicon distance frame by depositing an unstructured TEOS layer on the cover comprising the surface texture providing the area of reduced effective refractive index, depositing a CVD silicon layer preferably in an epitaxial reactor on the TEOS layer, masking the CVD silicon layer with a pattern that defines the distance frame, etching the CVD silicon layer and removing the TEOS layer from the cover wafer to expose the surface texture. An unstructured TEOS layer according to the invention covers the complete cover.

Again alternatively, the distance frame may be provided in form of a silicon distance frame by depositing an unstructured TEOS layer on the cover comprising the surface texture providing the area of reduced effective refractive index, bonding a silicon wafer to the TEOS layer, masking the silicon wafer with a pattern that defines the distance frame, etching the silicon wafer to create the distance frame from the material of the silicon and removing the TEOS layer from the cover to expose the surface texture. It is one advantage of a TEOS layer that it provides for an etching stopping layer. However, beside a TEOS-layer there are other possibilities for an etching stop layer as for example LP-CVD oxide, PE-CVD oxide, PE-CVD nitride or thermal oxidation. TEOS can be dry-etched without any residua. The advantages of an additive deposition of a silicon distance frame are that a very high frame can be provided under very low stress on the cover or the substrate material. Existing infrastructures can be used, so that low infrastructure costs are created. By the use of monocrystalline silicon permeation can be reduced.

By the use of a TEOS layer as described in different possibilities above the silicon distance frame can be deposited without any silicon residue remaining on the surface textures area, so that its quality is not negatively influenced. Additional oxidation of silicon, for example in the texture area, can be prevented.

As already stated above, the texture may be arranged on any appropriate place on the cover, in particular on the substrate far side of the cover or on both sides. To provide a texture on the substrate far side of the cover according to a preferred embodiment of the invention the method comprises the additional step of masking the cover except for an area on the substrate far side opposite the area of reduced refractive index, etching TEOS layer on the substrate far side, etching the material of the cover on the substrate far side to produce a cavity, masking the cover with a pattern inside the cavity, etching the masked cover to create an area with a surface texture according to the pattern, the surface texture comprising elevations and/or depressions that reduce the effective refractive index of the covers to provide for an area of reduced effective refractive index. This is of particular advantage if during building the distance frame a TEOS layer had been provided on the cover, because such a TEOS layer usually is deposited on each side of the cover, and the TEOS layer already present for the purpose of providing the distance frame may at the same time be used for providing an texture on the substrate far side of the cover.

With advantage, each of the above described methods may comprise the additional step of applying a getter material on the cover or the substrate preferably by an argon free evaporation process. Also concerning the method for applying the getter material reference is made to DE 10 2008 060 796.7, which is incorporated herein.

In one embodiment the method may comprise the additional step of masking the cover except for an area on the substrate far side opposite the area of reduced refractive index (that means except for the IR-window), etching TEOS layer on the substrate far side, etching the material of the cover on the substrate far side to produce a cavity, masking the cover with a pattern inside the cavity, etching the masked cover to create an area with a surface texture according to the pattern, the surface texture comprising elevations and/or depressions that reduce the effective refractive index of the covers to provide for an area of reduced effective refractive index.

The method may further comprise the additional step of applying a seal frame metallization on the silicon distance frame by gold and tin electroplating. The seal frame may in particular be provided by a method comprising the additional steps of full metal deposition of a metallic adhesion promoter layer, preferably a metallic adhesion thin film promoter layer, by thermal evaporation, deposition of an electrical electrode layer, preferably an electrical electrode thin film layer, by thermal evaporation or sputtering, masking the distance frame for selective metal deposition, electroplating of a gold- or a gold containing alloy-layer with optional nickel or copper carrier layer below and/or tin cover layer, masking of the distance frame with applied metal deposition, etching of the exposed electrical electrode layer to expose the adhesion promoter layer, additional masking of metal deposition with overlap and getter area, etching of the exposed adhesion promoter layer to expose the cover and define adhesion promoter areas as getter areas. The metallic adhesion promoter layer preferably comprises Ti, Cr, W, TiW, Mo, Ta, NiCr or mixtures thereof. The electrical electrode layer preferably comprises Au, Cu, Ag or mixtures thereof. According to one embodiment, the metallic deposition is also applied at the sides of the distance frame forming the cavity and wetting these sides to provide the above described buffer layer used to absorb excess solder during sealing the housing. An alternative for thermal evaporation may be sputtering of the metallic thin film layers.

In the case the metallic adhesion layer comprising Ti, the Ti may act as a getter material. The Ti based adhesion promoter layer then may be deposited onto the distance frame and for an area intended to be a getter area of the device. Afterwards, the Ti-coated distance frame and the "getter area" are masked so that the Ti containing coating remains in these areas after a following etching process.

The method may further comprise the additional step of depositing a Ge—ZnS layer on the cover, especially on the substrate far side of the cover. The Ge—ZnS layer can serve as a high pass filter, which can act as an interference filter deleting certain wavelengths. Several layers of Ge—ZnS may be provided (up to 50) with different layer thickness to eliminate several wavelengths.

The top surface of the cap wafer may completely be coated with a IR blocking layer with exception of the IR window areas. This IR blocking layer can serve as a lens aperture or optical diaphragm which may enhance the optical properties as image quality of the IR micro device. In the case that during fabrication of the IR micro device a TEOS layer has been applied to the cover, this TEOS layer may serve as IR blocking layer and preferably is not removed during further fabrication.

In the case that the method is performed on wafer level, the method may comprise the additional step of dicing the cover wafer and/or the substrate wafer. With particular advantage wafer dicing is performed by dicing the cover wafer first to expose contact pads without dicing the substrate wafer. After dicing of the cover wafer, the contact pads of all micro devices arranged of the substrate wafer are laid open. They now can be contacted to perform a measurement (electrical device characterization) of the performance of the micro devices as a kind of quality control. Quality control on wafer is of particular advantage because the complete multi housing wafer unit is to be arranged and adjusted relative to a controlling device. Once adjusted, every single IR micro device on the multi housing wafer unit can be controlled without additional adjusting steps which eases quality control. For electrical device characterization the undiced substrate with the diced cover wafer can be exposed to a test gas atmosphere. After that, the vacuum level of each IR-micro device can be measured, preferably by detecting the thermal insulation properties of the infrared micro unit. By this way, leaking devices can be identified and their position on the substrate wafer can be stored for later rejection. After having performed the electrical device characterization, the substrate wafer is diced to individualize the devices.

In order to describe the invention and to illustrate the processing, the preferred embodiments will now be described, by way of non-limiting example only, with reference to the accompanying drawings, in which:

DETAILED DESCRIPTION OF THE INVENTION

Figure 1:
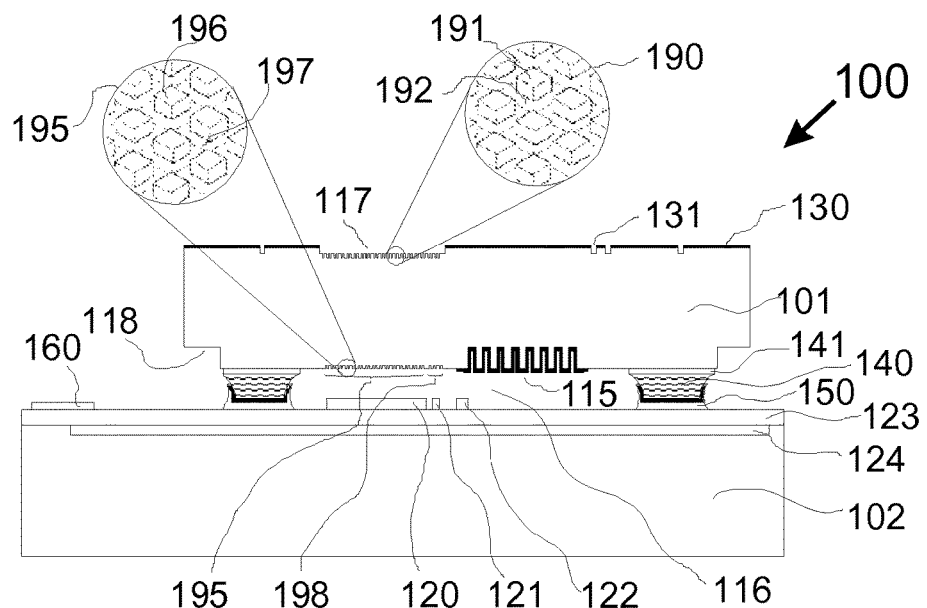
FIG. 1 shows a cut-away side view of an individual device of one preferred embodiment of the invention.

Reference is made to FIG. 1 showing an example of a infrared micro-bolometer array sensor 100 according to the invention. FIG. 1 shows the sensor 100 in a cross section of a representative package construction. Two round silicon wafers 101 and 102 with a diameter of 100 mm or larger and a thickness of not less than 300 µm are used; although other infrared transparent substrate materials such as germanium are suitable. A double side polished, high resistively silicon cover wafer with more than 1 Ohm·cm resistance, low crystal defect density and low oxygen content is preferred to fabricate the cover 101 to reduce the infrared absorption in the material of the cover 101.

A cavity 116 is formed by the use of a distance frame 140 arranged between cover 101 and substrate 102. The distance frame 140 encloses bolometer sensors 120, 121 and 122, which are examples for the IR-micro units, and a getter layer 115.

The distance frame 140 is made of silicon and has rounded side walls at least for a part of the vertical height. The crystal structure of this silicon frame may vary over the frame geometry in lengths and widths from epitaxial monocrystalline silicon to partly poly-crystalline or poly-crystalline. A interface layer 141 between distance frame 140 and silicon cover 101 may be present, consisting of a dielectric film such as TEOS, SiO2, SiN or a silicon nucleation layer. The silicon distance frame 140 is deposited in an additive process after the fine structure generation of the surface textures 195, 198 and 115 has been performed on the cover 101. Although the distance frame height can vary between 1 µm to 500 µm and the width can vary between 20 µm and some mm a width of around 180 µm and a height of around 70 µm is chosen in this example.

A metallic seal bond 150 joints the distance frame 140 to the sensor substrate 102. The seal bond is located on top of a part of the integrated read out circuit 124. A hermetic metallic seal can be formed with different metallurgies ranging from soft solder alloys over transient liquid phase formation, intermetallic diffusion bonds, thermocompression bonds to eutectic bonding. Two different eutectic techniques are preferred: eutectic gold-tin wafer bonding at around 300° C. and eutectic gold-silicon wafer bonding at around 400° C. The disclosed technique takes advantage of the earlier techniques developed by the inventor of the present application and disclosed in WO/2007/054524, according to which a cover wafer can be used to hermetically seal a microstructure in a cavity based on a metallic seal bond at temperatures between 265° C. and 450° C. with a wetting buffer around the seal frame for surplus liquid melt. In both cases gold rings are deposited by electroplating, preferably with a thickness around 3 µm. A tin layer is deposited by electroplating, preferably with a thickness of not less than 2 µm. The technology depends mostly on the temperature tolerance of the sensor components to be encapsulated. Both bond techniques are performed in a high vacuum environment. After seal formation, the hermetic seal maintains the vacuum inside the cavity 116 and protects the device against the environment.

The periphery of the lower side of the cover has a recessed area 118, in the range of 800 nm to 60 µm, relative to the cavity ceiling to allow for larger process tolerances during the cap dicing process. In this example a recess depths of around 20 µm is generated. The outward surface of the cover is coated with an infrared barrier layer 130 that has openings only in the marking area 131 and the infrared window area 117. The infrared window 117 is recessed relative to the outward surface of the cover for scratch protection. An acceptable range for the recess depths is between 0 µm to 50 µm; in some applications no recess may be necessary. In this example a recess depths of about 8 µm for the infrared window is preferred. The infrared window 117 is positioned above the bolometer array 120 and the additional bolometers 121 and is preferably 0 µm to 200 µm larger than the sensor arrays to compensate for alignment tolerances during the wafer bonding process. In this example an oversizing of 60 µm of each side of the window is preferred.

The recessed surface within the infrared window 117 is structured with a defined texture of posts 190. The posts 191 are etched by reactive ion etching into the silicon substrate 101 to reduce the material density which lowers the effective refractive index of the silicon surface. The accurate etched shape depends on the selected centre wavelengths to pass the silicon cover and the form of the posts. The posts have all the same etch depths and preferably the same side wall angle, which are in this example between 1300 to 1700 nm deep and around 90° side angle for a centre wavelength of 10 µm. Although the contour of the posts can be chosen arbitrarily between round, square, star shape and other forms this example prefers round cylindrical posts of a diameter around 1500 nm standing up from a lower bottom surface having all the same top surface level. The posts have a defined spacing 192, in this example around 1100 nm.

On the inner side of the cover is a separate field of posts 195 aligned with the upper field of posts 190. The posts 196 in field 195 may have the same geometrical dimensions, properties and spacing 197 in as the field of posts 190. In another example, the posts in field 195 may be designed with different geometry to block short wavelengths below 7 µm, although these geometries will differ only very little from the dimensions of the posts 195. In a special case, an additional field of posts 198 with different transmission characteristics optimized for a selected short wavelength in the range of 2 µm to 5 µm is formed beside the field of posts 195 and vertically aligned with dedicated micro-bolometers 121 to enable advanced detection functions.

The bolometer array 120 within package cover 100 is fabricated on the semiconductor substrate 102 of silicon on top of the final wafer passivation 123 covering an integrated read out circuit 124. Sensor pixels are aligned in rows and columns of a rectangular matrix, additional pixels 121 may be present to form a field or row beside the bolometer array 120 still in the area exposed to infrared radiation. One or more individual bolometer sensors 122 may be located in an area not exposed to infrared radiation to be used as vacuum gauge or background monitor. These sensors may have a different design than the bolometer sensors in the array 120 making them more sensitive to thermal coupling by the residual atmosphere inside the cavity. In most applications, array 120 is operated uncooled at room or ambient temperature. Operation in the temperature range between −50° C. up to +80° C. is possible. The package cover 100 allows the operation also at temperatures near 0 K due to the use of a construction based on pure silicon which minimizes thermo mechanical stresses. Operation in harsh environments is therefore possible. The integrated read out circuit 124 measures the resistance changes in each bolometer due to the absorbed incident infrared radiation from a warm body, processes the signals and wires the signals out below the final wafer passivation 123 to the electrical contact pads 160 outside the distance frame 140.

Figure 2:
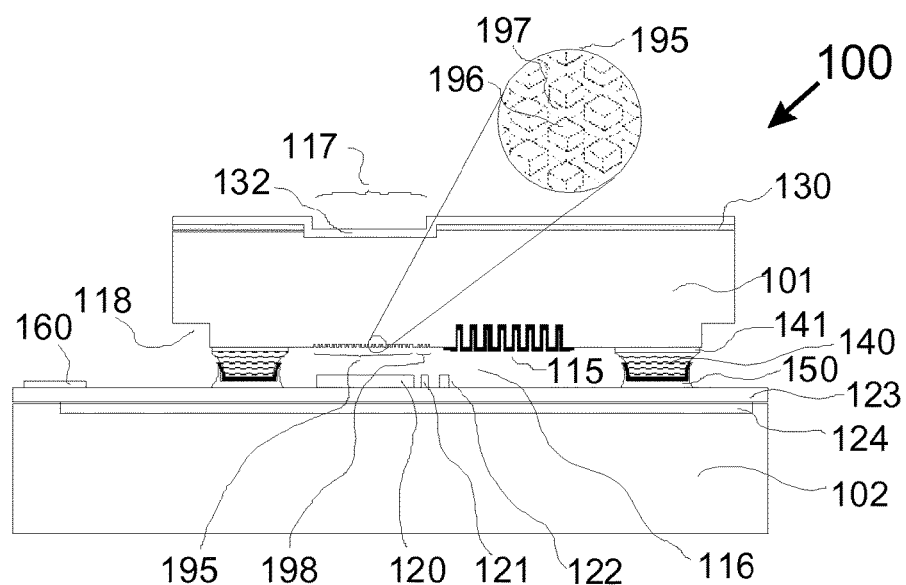
FIG. 2 shows a cut-away side view of an individual device of one preferred embodiment of the invention.

FIG. 2 is a cross section of a representative package cover construction of a infrared micro-bolometer array sensor 100 as an other embodiment of the invention. The same reference numbers are used for identifying components in the illustrations of FIGS. 1 to 3. In this example the outward surface of the cover is coated with a barrier layer 130 except for a recessed infrared window 117 area. The whole surface of the package cover is coated with a thin film infrared antireflection coating 132. In this example described, the antireflective coating 132 preferred is a multi-layer film system of Ge—ZnS in a layer thickness of around 1 μm and optimized to block short wavelength radiation below 7 to 8 μm. Although different alternative single layer coatings like AlN or diamond like carbon can also be applied in the sense of the invention.

Figure 3:
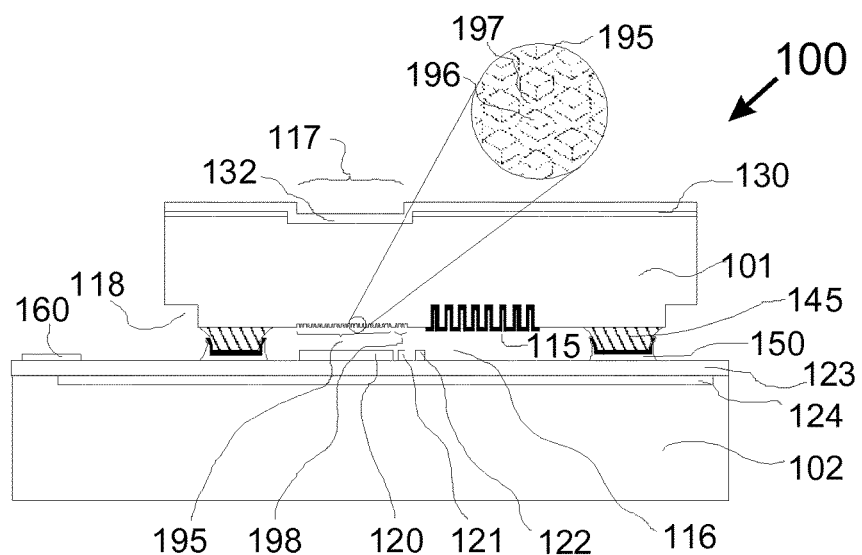
FIG. 3 shows a cut-away side view of an individual device of one preferred embodiment of the invention.

FIG. 3 is a cross section of a representative package cover construction of a infrared micro-bolometer array sensor 100 as yet another embodiment according to the invention. In this example, the silicon distance frame 145 is monocrystalline without an interface layer of different crystal lattice other than the silicon substrate 102. This construction is very favourable to achieve and maintain high vacuum inside the cavity 116 as Helium permeation from the natural partial pressure of Helium in air through the package cover can be minimized. This property is also beneficial when the device operated in artificial gas environments that contain Helium, e.g. a Helium cryostat.

Figure 4:
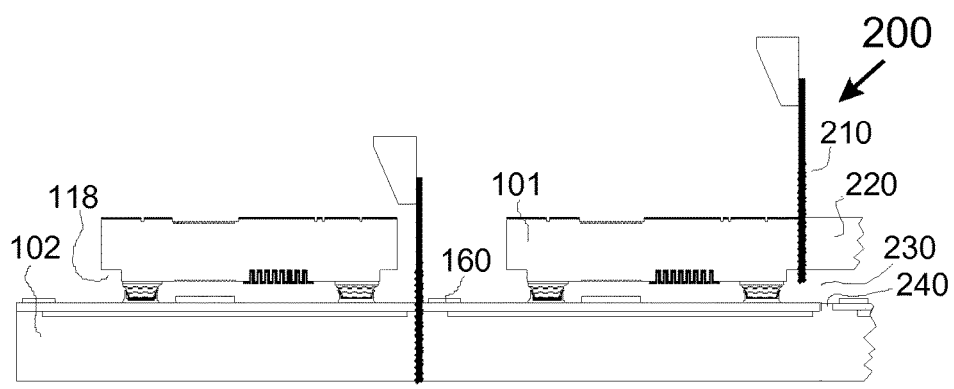
FIG. 4 shows a cut-away side view of the cap wafer and device wafer dicing process sequence of one preferred embodiment of the invention.

FIG. 4 is a cross section side view of the cover wafer and device wafer construction 200 as one embodiment of the invention to enable a dicing of the cover wafer and the device wafer. In the sense of the invention, the cover wafer 101 has no opening holes until after the wafer bonding step to provide direct electrical access to the contact pads 160. As a preferred embodiment, the cover wafer offers a recessed peripheral area 230 around each distance frame with a recess height given by the height of the distance frame plus the recess depths 118 plus the height of the metallic seal frame 150. In this example, the inward surface of the recessed peripheral area of the cover wafer is about 93 μm to 98 μm above the surface of the sensor wafer 102. A part of the cover wafer 220 is cut out with a double line dicing process to generate an access to the contact pads. The cover wafer dicing process is performed with a rotating dicing blade 210 run at a defined height above the sensor wafer surface and with a defined outward offset to the distance frame around each sensor device to avoid touching the hermetic seal frame. The part 220 is removed with the cooling and cleaning water jets of the dicer. A second dicing step is performed with a rotating dicing blade 210 in the dicing street 240 to individualize the sensor wafer into individually sealed micro-bolometer array sensors.

Figure 5:
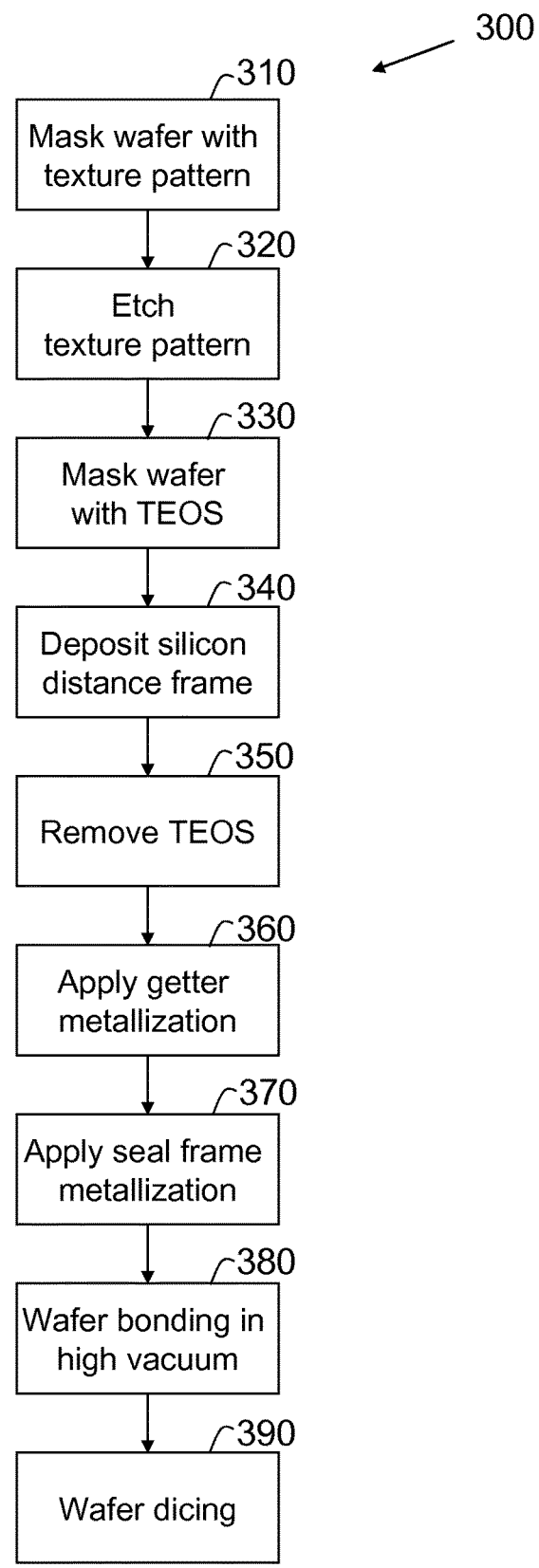
FIG. 5 shows a flowchart of the method of making a detector package (without cap frontside process according) to the invention.

FIG. 5 is a flowchart of a method 300 of making the cavity side, sealing and wafer dicing of a detector package cover 100 of FIGS. 1 to 3 as one embodiment using a selective epitaxial silicon deposition of the invention. In block 310 a resist mask is applied to cover the surface of a flat silicon wafer with a number of individual texture patterns 195 aligned with the infrared window 117.

The patterns are etched in block 320 to defined depths to create an area with posts 195 (antireflective surface texture) that reduces the effective refractive index on the cavity ceiling of the silicon cover 101. Etching is preferably performed with an anisotropic reactive ion etching (RIE) process. In the example according to the invention a etch depths of between 1.3 μm to 1.6 μm is preferred depending on the geometry of the posts and based on a centre wavelength of 10 μm.

Block 330 deposits a structured TEOS layer to define an anorganic mask that defines the selective growth regions of the silicon distance frame 140. The silicon deposits only on areas of exposed silicon of the substrate wafer. The TEOS layer conformally covers and protects all detailed structures of the wafer like the field of posts, the surface topography for a getter field and all lithography marks. In this example the TEOS layer is 200 nm thick.

Block 340 shows the deposit of the silicon distance frames 140 to define the depth of the cavities and the widths of the seal frames. The silicon growth mechanism in almost the complete frame area is epitaxial which reduces the layer stress to a minimum. Although very thick distance frames can be grown, the example limits the distance frame height to about 70 μm to achieve a higher wafer throughput.

Block 350 shows the remove of the TEOS layer on the cavity side of the cover to expose the wafer surface 101 with the field of posts 195.

In block 360 a titanium/gold plating base metallization and an additional titanium based getter metallization 115 are applied on the wafer by an argon free evaporation process. The preferred layer thickness for the plating base is about 30 nm titanium and about 100 nm gold. The preferred layer thickness for the getter layer is about 500 nm.

In block 370 a thick resist mask is applied on the wafer and a gold/tin seal frame metallization is deposited only onto the silicon distance frame by electroplating. In this example gold is plated first with a thickness of less than 6 μm followed by a tin layer with a thickness of less than 3.5 μm.

In block 380 wafer bonding is performed in a high vacuum capable wafer bonder. Wafers are aligned to each other and hold in a distance of about 100 μm to evacuate all cavities down to about 5·10E-5 mbar before they are pressed together and the seal 150 is formed under temperature and static force. In this example a eutectic gold/tin bond is created at around 300° C. with an additional time span of about 30 minutes to thermally activate the titanium getter 115.

In block 390 the devices are individualized with a wafer dicing process 200 performed in two steps. After dicing the cover wafer 101 the parts 220 are removed and a direct access to the contact pads 160 is available. This enables an electrical device characterization and a hermeticity test on wafer level using standard wafer probes. In a final dicing step, the sensor wafer is diced along the dicing streets 240 to separate the devices on a dicing tape.

Figure 6:
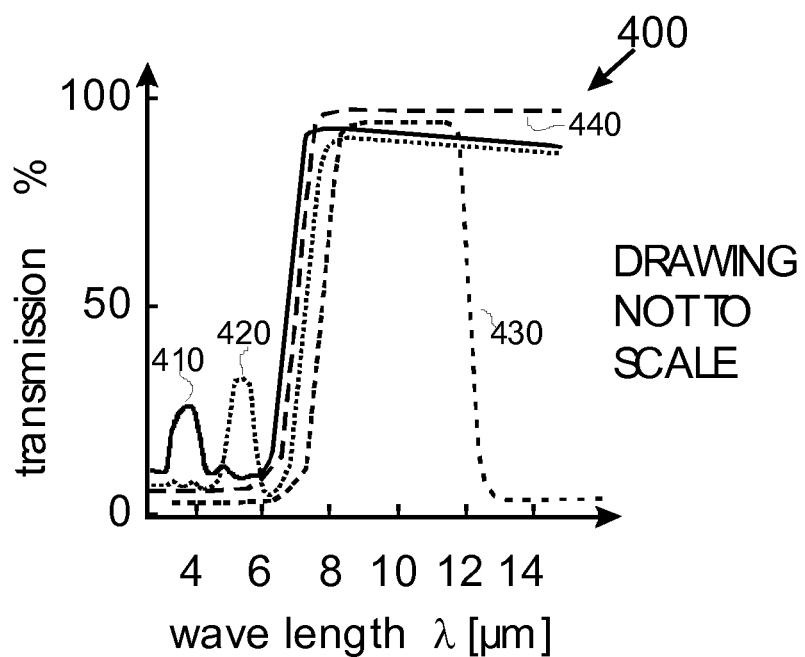
FIG. 6 shows a graph of the transmittance of the infrared window of FIGS. 1 to 3 over the range of wavelengths and FIG. 7 shows the predicted refractive index for polarization-independent square pillar structure calculated from equation (2), source: "Antireflection surfaces in silicon using binary optics technology" of M. E. Motamedi, W. H. Southwell, W. J. Gunning in Applied Optics Vol. 31, No. 22, 1992, pages 4371-4376.
Figure 7:
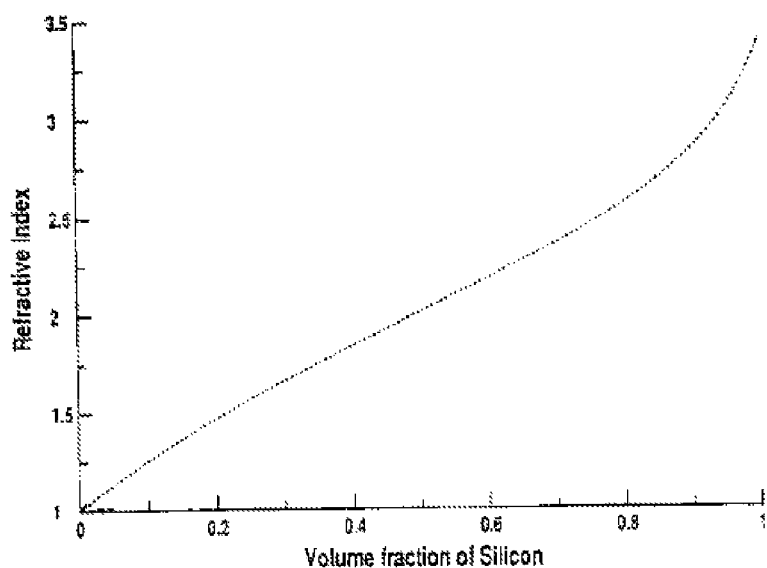

FIG. 6 shows a graph of the transmittance of the infrared window of FIGS. 1 to 3 over the near infrared band of 3 μm to 15 μm. Curve 410 depicts the transmittance of a window with a single sided field of posts of defined geometry as antireflective surface texture with a high pass at around 7 μm and a side transmission band pass at around 4 μm. Curve 420 depicts the transmittance of a window with a single sided field of posts of an other defined geometry as antireflective surface texture with a high pass characteristics at around 7.5 µm and a side transmission at around 5.5 µm. According to the invention, the short wavelength blocking characteristics of the two different surface textures can be improved when applied in combination one on each side of the package cover 101 in the infrared window 117 as shown in FIG. 1. Curve 430 shows the ideal 8 µm to 12 µm band pass characteristic of a Ge—ZnS multi-layer system. Since typically 50-80 layers are required for those filter coatings they are very expensive. Curve 440 documents a Ge—ZnS high pass filter system that can be achieved with less than 10 layers. In a preferred embodiment, a combination of a field of posts with high transmission starting in the range of 7 µm to 8 µm and a Ge—ZnS high pass filter on the cover outer side with a high transmission starting in the range of 8 µm as shown in FIGS. 2 and 3 is applied. The Ge—ZnS thin film multi-layer system is deposited by evaporation at substrate temperatures below 200° C. and has a degradation temperature around 320° C. The multi-layer system is scratch sensitive and difficult to structure by wet etching. In the example, the filter is therefore applied on the cover wafer as an unstructured film only after the wafer bonding and getter activation process is finished.

The invention claimed is:

1. A method of housing an infrared radiation micro unit the method having the following steps:
   providing a housing comprising a cover, a substrate, and a silicon distance frame, wherein the substrate is part of a substrate wafer and the cover is part of a cover wafer;
   masking the cover with a pattern configured to form an area with a surface texture, the surface texture provided to reduce an effective refractive index of the cover;
   etching the cover as patterned and creating the area with the surface texture comprising one of elevations and depressions that reduce the effective refractive index of the cover within the area;
   providing the silicon distance frame on a substrate side of the cover, wherein the silicon distance frame is provided by:
      depositing an unstructured TEOS layer on the cover comprising the surface texture, thus also covering the area of reduced effective refractive index with the unstructured TEOS layer;
      depositing by a CVD a silicon layer on the unstructured TEOS Layer;
      masking the CVD deposited silicon layer with a pattern that defines the silicon distance frame;
      etching the CVD deposited silicon layer to provide the silicon distance frame;
      removing the unstructured TEOS layer from the cover, outside the silicon distance frame, to expose the surface texture having the reduced effective refractive index;
   bonding of substrate and cover with the silicon distance frame being intermediate, whereby substrate, cover and distance frame form a cavity, housing the infrared radiation micro unit to provide an infrared radiation micro device on a wafer level; and
   wherein the cover wafer is diced and the substrate wafer is not diced, exposing the undiced substrate wafer with the diced cover wafer for electrical device characterization to a test gas atmosphere, measuring a vacuum level, thereby identifying leaking infrared radiation micro device on the undiced substrate wafer for a later rejection.

2. The method according to claim 1, further comprising applying a getter material on the cover or the substrate.

3. The method according to claim 2, wherein getter material is applied by an argon free evaporation process.

4. The method according to claim 1, further comprising applying a seal frame metallization on the silicon distance frame by gold and tin electroplating.

5. The method according to claim 1, further comprising depositing several layers of Ge—ZnS on the cover, each Ge—ZnS-layer having a different layer thickness for eliminating several wavelengths of an incident infrared radiation.

6. The method according to claim 5, wherein the several layers are deposited on the substrate far side of the cover and being a Ge—ZnS-multilayer system.

7. The method according to claim 1, further comprising bonding of substrates and covers with intermediate silicon distance frames, whereby each group of substrate, cover and silicon distance frame forms its own cavity, housing an individual infrared radiation micro unit.

8. The method according to claim 1, wherein as the cover wafer is diced electrical contact pads are exposed.

9. The method according to claim 1, wherein the substrate wafer is diced to singulate tested infrared radiation micro devices.

10. The method according to claim 1, wherein the vacuum level is measured by detecting thermal insulation properties of the housed infrared micro units.

* * * * *